United States Patent
Fujiu et al.

(10) Patent No.: US 10,860,251 B2
(45) Date of Patent: Dec. 8, 2020

(54) SEMICONDUCTOR MEMORY DEVICE

(71) Applicant: Toshiba Memory Corporation, Tokyo (JP)

(72) Inventors: Masaki Fujiu, Kanagawa (JP); Toshihiro Suzuki, Tokyo (JP); Mitsuhiro Abe, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/286,535

(22) Filed: Feb. 26, 2019

(65) Prior Publication Data

US 2019/0391758 A1    Dec. 26, 2019

(30) Foreign Application Priority Data

Jun. 26, 2018    (JP) .................................. 2018-121119

(51) Int. Cl.
| | |
|---|---|
| *G06F 3/06* | (2006.01) |
| *G11C 16/30* | (2006.01) |
| *G11C 16/04* | (2006.01) |
| *G11C 16/08* | (2006.01) |
| *G11C 11/56* | (2006.01) |

(52) U.S. Cl.
CPC .......... *G06F 3/0659* (2013.01); *G06F 3/0604* (2013.01); *G06F 3/0679* (2013.01); *G11C 16/0483* (2013.01); *G11C 16/08* (2013.01); *G11C 16/30* (2013.01); *G11C 11/5621* (2013.01); *G11C 11/5671* (2013.01)

(58) Field of Classification Search
None
See application file for complete search history.

(56) References Cited

U.S. PATENT DOCUMENTS

| | | | |
|---|---|---|---|
| 7,920,431 | B2 | 4/2011 | Nobunaga et al. |
| 2013/0128675 | A1 | 5/2013 | Kim et al. |
| 2013/0318285 | A1* | 11/2013 | Pignatelli ............ G06F 12/0246 |
| | | | 711/103 |
| 2013/0325915 | A1 | 12/2013 | Ukai |
| 2017/0060453 | A1 | 3/2017 | Kodera et al. |
| 2019/0102105 | A1* | 4/2019 | Bergman .............. G06F 3/0658 |

FOREIGN PATENT DOCUMENTS

JP    2013109823 A    6/2013

* cited by examiner

*Primary Examiner* — Gary W. Cygiel
(74) *Attorney, Agent, or Firm* — Kim & Stewart LLP

(57) ABSTRACT

A semiconductor memory device includes a first plane including a memory cell array, a second plane including a memory cell array, a control circuit configured to control operations performed on the first and second planes separately and independently, and first register for storing a condition value related to a condition of an operation to be performed on a plane. When a first command to store a first condition value in a first address of the first register is received, the control circuit specifies a plane to which the first address has been allocated. When the first plane is specified by the first address, the control circuit determines whether the first plane is in a command receivable state. Then, when the control circuit determines that the first plane is in the command receivable state, the control circuit stores the first condition value in the first address of the first register.

12 Claims, 12 Drawing Sheets

SEMICONDUCTOR MEMORY DEVICE

CROSS-REFERENCE TO RELATED APPLICATION

This application is based upon and claims the benefit of priority from Japanese Patent Application No. 2018-121119, filed Jun. 26, 2018, the entire contents of which are incorporated herein by reference.

FIELD

Embodiments described herein relate generally to a semiconductor memory device.

BACKGROUND

A NAND type flash memory is known as a semiconductor memory device.

DETAILED DESCRIPTION

Embodiments provide a semiconductor memory device capable of performing an accurate read operation at a high speed.

In general, according to one embodiment, a semiconductor memory device includes a first plane including a memory cell array, a second plane including a memory cell array, a control circuit configured to control operations performed on the first and second planes separately and independently, and first register for storing a condition value related to a condition of an operation to be performed on one of the planes. When a first command to store a first condition value in a first address of the first register is received, the control circuit specifies a plane to which the first address has been allocated. When the first plane is specified by the first address, the control circuit determines whether the first plane is in a command receivable state, and then, when the control circuit determines that the first plane is in the command receivable state, the control circuit stores the first condition value in the first address of the first register.

Hereinafter, the embodiments will be described with reference to the accompanying drawings. The referred-to drawings illustrate schematic views. In the following description, components having the same function and configuration will be referred to using the same reference numbers. A letter is attached to the reference numbers to distinguish components that have the same function and configuration from each other. When it is unnecessary to distinguish such components from each other, such components will be referred to using only the reference number.

[1] Embodiment

Hereinafter, a semiconductor memory device and a memory system according to an embodiment will be described.

[1-1] Configuration

[1-1-1] Configuration of Memory System 1

Figure 1:
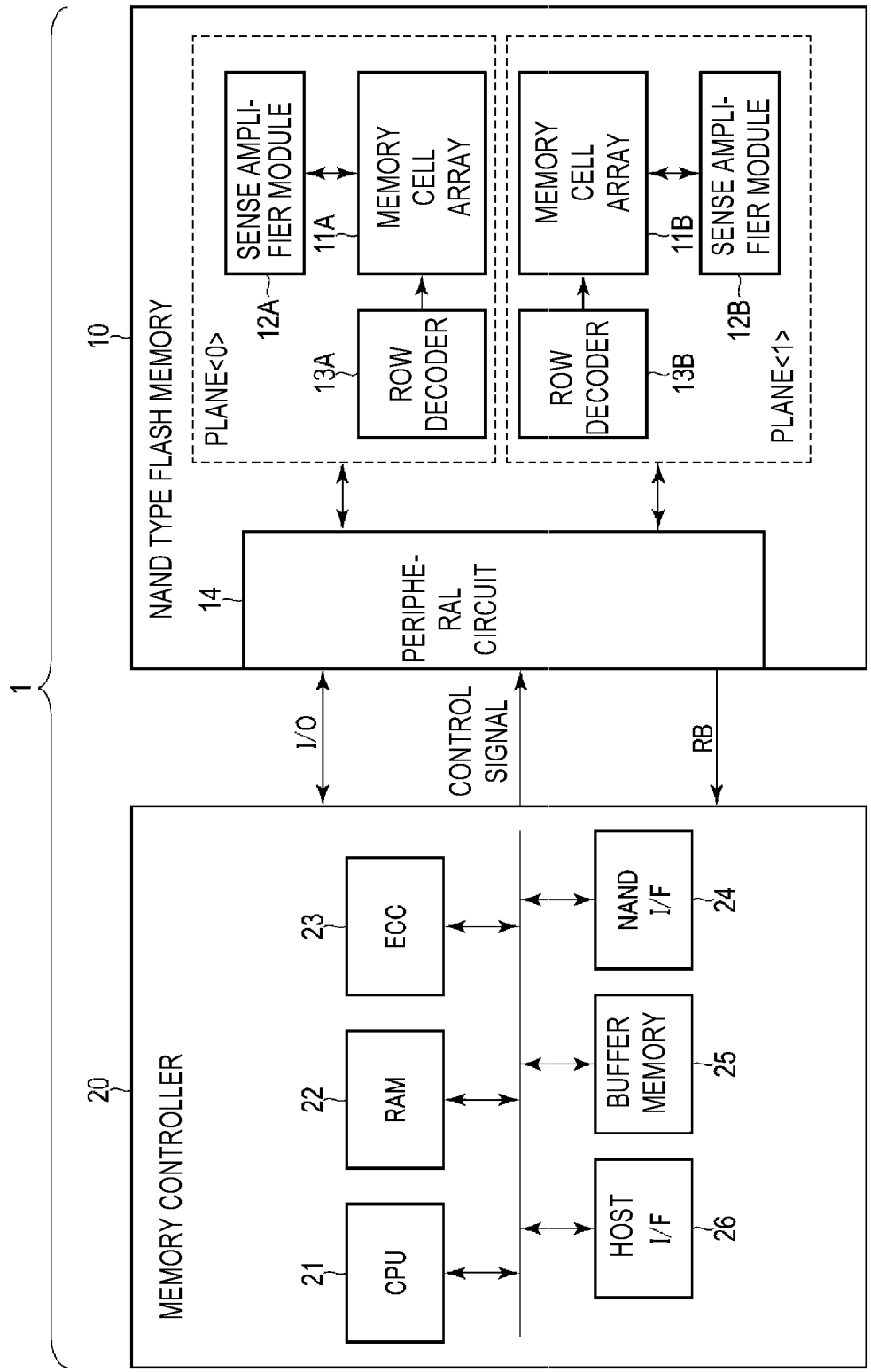
FIG. 1 is a block diagram of a memory system according to an embodiment.

First, a configuration of the memory system will be described with reference to FIG. 1. FIG. 1 illustrates a block diagram of the memory system. As illustrated in FIG. 1, the memory system 1 includes a semiconductor memory device 10 and a memory controller 20.

The semiconductor memory device 10 is a NAND type flash memory that stores data in a nonvolatile manner. Further, the semiconductor memory device 10 includes multiple planes each including a memory cell array which is an area for storing data, and capable of being independently controlled. The detailed configuration of the semiconductor memory device 10 will be described later.

The controller 20 issues commands, for example, read, write, and erase commands, to the semiconductor memory device 10, in response to a command from an external host device (not illustrated). Further, the controller 20 manages a memory space of the semiconductor memory device 10.

As illustrated in FIG. 1, the controller 20 includes a processor (CPU) 21, a built-in memory (RAM) 22, an ECC circuit 23, a NAND interface circuit 24, a buffer memory 25, and a host interface circuit 26.

The processor 21 controls the entire operation of the controller 20. For example, the processor 21 issues a read command based on a NAND interface in response to a write command received from the host device. This operation is also similarly performed in the case of write and erase.

The built-in memory 22 is, for example, a semiconductor memory such as a DRAM, and is used as a work area of the processor 21. The built-in memory 22 holds, for example, a firmware to manage the semiconductor memory device 10 and various management tables.

The ECC circuit 23 performs a data error checking and correcting (ECC) processing. Specifically, at the time of data write, the ECC circuit 23 generates a parity based on write data. Then, the ECC circuit 23 generates a syndrome from the parity at the time of data write and detects an error and corrects the detected error using the syndrome at the time of data read.

The NAND interface circuit 24 is connected to the semiconductor memory device 10 to communicate with the semiconductor memory device 10. For example, the NAND interface circuit 24 transmits and receives an input/output signal I/O with the semiconductor memory device 10. Further, the NAND interface circuit 24 transmits various control signals to the semiconductor memory device 10, and receives a ready busy signal RB from the semiconductor memory device 10. The ready busy signal RB is a signal for notifying the controller 20 of whether the semiconductor memory device 10 is in a ready or busy state. The ready state indicates a state where the semiconductor memory device 10 is able to receive a command from the controller 20, and the busy state indicates a state where the semiconductor memory device 10 is unable to receive a command. For example, the ready busy signal RB becomes an "L" level during the operation of the semiconductor memory device 10, and becomes an "H" level when the operation is completed.

The buffer memory 25 temporarily stores, for example, data that the controller 20 receives from the semiconductor memory device 10 and the host device.

The host interface circuit 26 is connected to the host device via a host bus (not illustrated) to communicate with the host device. For example, the host interface circuit 26 transmits a command and data received from the host device, to each of the processor 21 and the buffer memory 25.

[1-1-2] Configuration of Semiconductor Memory Device 10

Next, the detailed configuration of the semiconductor memory device 10 will be described with reference to FIG. 1. As illustrated in FIG. 1, the semiconductor memory device 10 includes a plane <0> (also denoted by PB0), a plane <1> (also denoted by PB1), and a peripheral circuit 14. The planes <0> and <1> include memory cell arrays 11A and 11B, sense amplifier modules 12A and 12B, and row decoders 13A and 13B, respectively.

Each of the memory cell arrays 11A and 11B includes multiple nonvolatile memory cells each of which is associated with bit lines and word lines. The detailed configuration of the memory cell array 11 will be described later.

The sense amplifier modules 12A and 12B correspond to the memory cell arrays 11A and 11B, respectively. The sense amplifier module 12 reads data from the memory cell array 11, and outputs the read data to the controller 20. Further, the sense amplifier module 12 transmits write data received from the controller 20, to the memory cell array 11. Further, the sense amplifier module 12 includes a cache circuit (not illustrated), and the cache circuit is used for a data exchange with the peripheral circuit 14.

The row decoders 13A and 13B correspond to the memory cell arrays 11A and 11B, respectively. The row decoder 13 selects a word line corresponding to a memory cell which is a target of a read operation and a write operation. Then, the row decoder 13 applies desired voltages to the selected word line and the other non-selected word lines, respectively.

Each plane described above serves as a unit on which the read operation, the write operation, and the erase operation can be independently executed. Specifically, the semiconductor memory device 10 may execute the read operation, the write operation, or the erase operation on one of the two planes, while executing the read operation, the write operation, or the erase operation on the other plane. That is, the plane is the minimum unit to be subjected to the read operation, the write operation, and the erase operation, and these operations may be performed for each plane or may be performed for multiple planes in parallel. In addition, the configuration of the plane is not limited to that described above, so long as each plane includes at least the memory cell array 11.

[1-1-2-1] Configuration of Memory Cell Array 11

Figure 2:
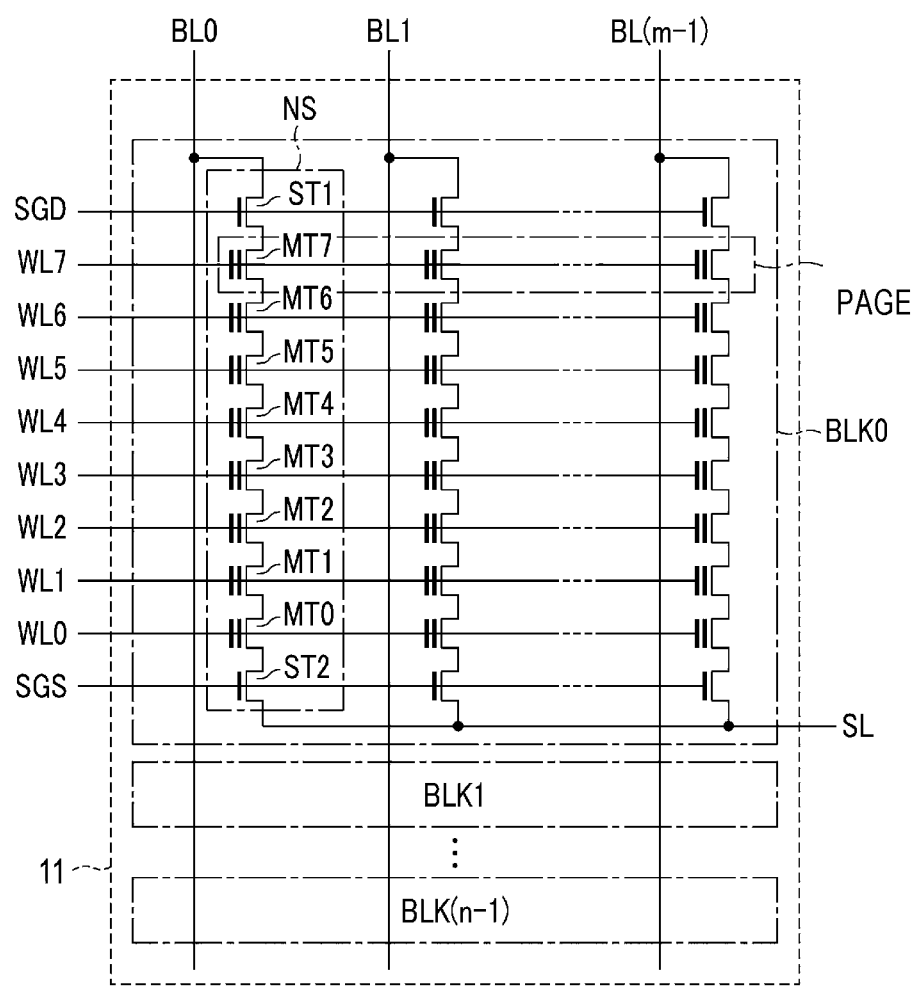
FIG. 2 is a circuit diagram of a memory cell array in a semiconductor memory device according to the embodiment.

Next, the configuration of the memory cell array 11 will be described with reference to FIG. 2. FIG. 2 illustrates a circuit diagram of the memory cell array 11. As illustrated in FIG. 2, the memory cell array 11 includes blocks BLK0 to BLK(n−1) ((n−1) is a natural number of 1 or more).

The block BLK is a group of multiple nonvolatile memory cells, and serves as, for example, a data erase unit. Each block BLK includes multiple NAND strings NS.

The NAND strings NS correspond to bit lines BL0 to BL(m−1) ((m−1) is a natural number of 1 or more), respectively, and each NAND string NS includes, for example, 8 memory cell transistors MT (MT0 to MT7) and select transistors ST1 and ST2. The number of the memory cell transistors MT in one NAND string NS is not limited to 8, and may be any number.

The memory cell transistor MT has a control gate and a charge storage layer, and stores data in a nonvolatile manner. Further, the memory cell transistor MT is able to store multiple bits of data by using a multi-level cell (MLC) method. The number of bits of data stored in the memory cell transistor MT is not limited, and for example, a single-level cell (SLC) method for storing 1-bit data in a memory cell may be used.

In the same NAND string NS, the memory cell transistors MT0 to MT7 are connected to each other in series between the source of the select transistor ST1 and the drain of the select transistor ST2. In the same block BLK, the gates of the select transistors ST1 and ST2 are connected in common to select gate lines SGD and SGS, respectively, and the control gates of the memory cell transistors MT0 to MT7 are connected in common to word lines WL0 to WL7, respectively.

In the memory cell array 11, the bit line BL is connected in common to the NAND strings NS of the same column across the multiple blocks BLK. Specifically, the drains of the select transistors ST1 in the NAND strings NS of the same column are connected in common to the corresponding bit line BL. Further, in the memory cell array 11, the sources of the multiple select transistors ST2 in each block BLK are connected in common to a source line SL.

In the configuration described above, a group of 1-bit data held by multiple memory cells connected to a common word line WL is called a "page." Accordingly, for example, when the MLC method of storing 2-bit data in a memory cell is applied, data corresponding to 2 pages is stored in the group of multiple memory cells connected to one word line WL. The data read operation is performed for each page. The write operation may be performed for each page or for each word line WL.

Figure 3:
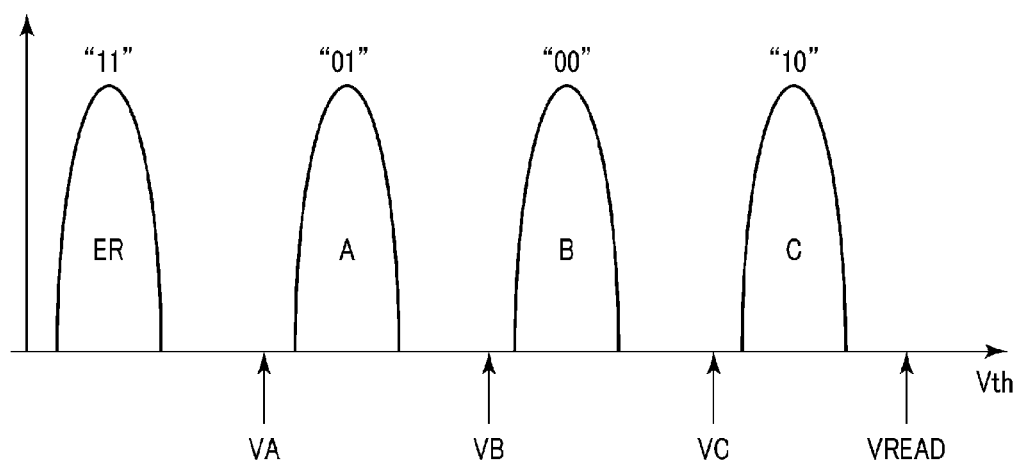
FIG. 3 is a threshold voltage distribution of memory cells.

FIG. 3 illustrates an example of a relationship between data of the memory cells and threshold voltage distributions according to the embodiment. In FIG. 3, for example, a NAND memory of 4 values will be described. The NAND memory of 4 values is configured such that a threshold voltage in one memory cell may be any one of 4 threshold voltages. Data assigned to the 4 threshold voltages (ER, A, B, and C) are, for example, data "11," "01," "00," "10." In reality, even when multiple memory cells MC have the same threshold voltage, the threshold voltage varies due to a variation of characteristics of the memory cells, and thus, has the distribution illustrated in FIG. 3.

Voltages VA, VB, and VC are voltages that are applied to a selected word line at the time of 4-value data read. A voltage Vread is a read voltage that is applied to non-selected memory cells of the NAND cells so as to make the non-selected memory cells conductive, irrespective of data stored therein, at the time of data read. The magnitude relationship of the voltages described above is VA<VB<VC<Vread.

The threshold voltage distributions illustrated in FIG. 3 are merely an example, and the embodiment is not limited thereto.

[1-1-2-2] Configuration of Peripheral Circuit 14

Figure 4:
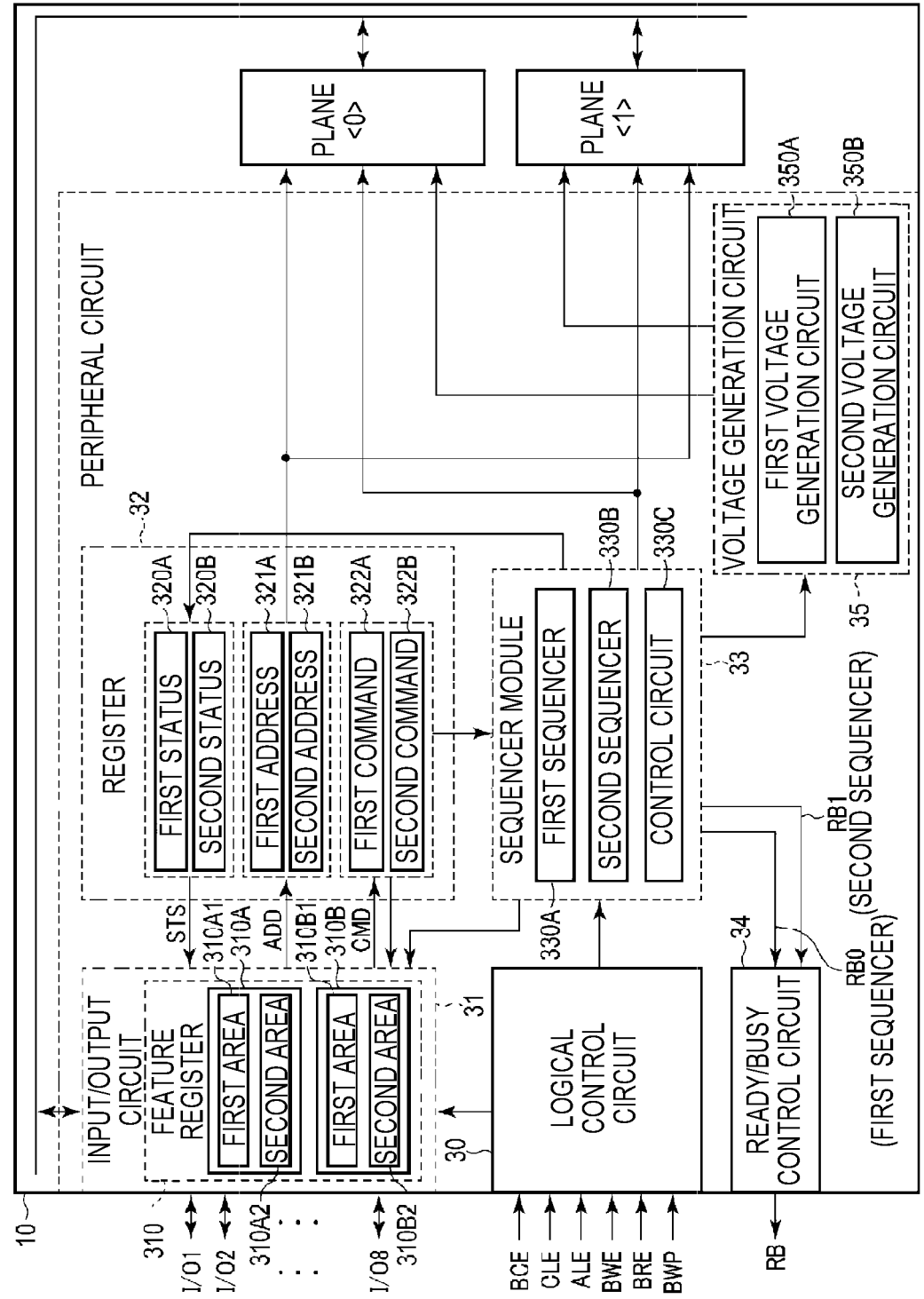
FIG. 4 is a block diagram of the semiconductor memory device according to the embodiment.

Next, the detailed configuration of the peripheral circuit 14 that controls the planes <0> and <1> will be described with reference to FIG. 4. FIG. 4 is a block diagram of the semiconductor memory device 10, and illustrates the configuration of the peripheral circuit 14 that controls each plane and an example of a signal transmitted and received between the semiconductor memory device 10 and the controller 20.

As illustrated in FIG. 4, the peripheral circuit 14 includes a logical control circuit 30, an input/output circuit 31, a register 32, a sequencer module 33 (which is, e.g., a control circuit), a ready/busy control circuit 34, and a voltage generation circuit 35.

The logical control circuit 30 receives various control signals from the controller 20, and transmits the control signals to the input/output circuit 31 and the sequencer module 33. The control signals are, for example, a chip enable signal /CE, a command latch enable signal CLE, an address latch enable signal ALE, a write enable signal /WE, a read enable signal /RE, and a write protect signal /WP. The signal /CE is a signal for enabling the semiconductor memory device 10. The signal CLE is a signal for notifying, to the input/output circuit 31, that a signal input to the semiconductor memory device 10 in parallel with an asserted signal CLE is a command CMD. The signal ALE is a signal for notifying, to the input/output circuit 31, that a signal input to the semiconductor memory device 10 in parallel with an asserted signal ALE is address information ADD. The signals /WE and /RE are signals for instructing the input/output circuit 31 to receive an input or transmit an output through an input/output signal I/O. The signal /WP is a signal for setting the semiconductor memory device 10 to be in a write protection state, for example, when a power is turned ON/OFF.

The input/output circuit 31 transmits and receives, for example, 8-bit input/output signals I/O (I/O 1 to I/O 8) with the controller 20. The input/output signals I/O that are transmitted by the input/output circuit 31 to the controller 20 may be, for example, status information STS and read data DAT. Meanwhile, the input/output signals I/O that are received by the input/output circuit 31 from the controller 20 may be, for example, a command CMD, address information ADD, and write data DAT. Further, the input/output circuit 31 transmits the write data DAT received from the controller 20 to the sense amplifier module 12, and transmits read data DAT transmitted from the sense amplifier module 12 to the controller 20.

In addition, the input/output circuit 31 includes a feature register 310. The feature register 310 includes an external feature register 310A and an internal feature register 310B. The external feature register 310A has a table capable of storing various pieces of data (e.g., condition values related to an operation condition of the semiconductor memory device), and is rewritable by, for example, a parameter write command called set feature. Based on, for example, a command of the sequencer module 33, the various pieces of data stored in the external feature register 310A are transmitted to the internal feature register 310B, and the internal feature register 310B stores the data in a table. An example of the table is a table related to the voltages applied to the word lines at the time of the read operation, and the sequencer module 33 may set the voltages at the time of the read operation by referring to the table. In addition, the external feature register 310A includes a first area 310A1 that stores feature data for the plane <0> and a second area 310A2 that stores feature data for the plane <1>, and these areas are distinguishable from each other by feature addresses. Similarly, the internal feature register 310B includes a first area 310B1 that stores feature data for the plane <0> and a second area 310B2 that stores feature data for the plane <1>, and these areas are distinguishable from each other by features addresses.

The register 32 includes a first status register 320A, a second status register 320B, a first address register 321A, a second address register 321B, a first command register 322A, and a second command register 322B. When the first status register 320A and the second status register 320B are not distinguished from each other, the registers will be referred to as the status register 320. When the first address register 321A and the second address register 321B are not distinguished from each other, the registers will be referred to as the address register 321. When the first command register 322A and the second command register 322B are not distinguished from each other, the registers will be referred to as the command register 322.

The first status register 320A holds status information STS indicating an operation state of a first sequencer module 330A to be described later. The second status register 320B holds status information STS indicating an operation state of a second sequencer module 330B to be described later.

The first address register 321A receives address information ADD on the plane <0> from the input/output circuit 31, and stores the address information ADD. Then, the first address register 321A transmits each of a column address CA, a block address BA, and a page address PA which are included in the address information ADD, to the sense amplifier module 12A, the row decoder 13A, and a first voltage generation circuit 350A to be described later. The second address register 321B receives address information ADD on the plane <1> from the input/output circuit 31, and stores the address information ADD. Then, the second address register 321B transmits each of a column address CA, a block address BA, and a page address PA which are included in the address information ADD, to the sense amplifier module 12B, the row decoder 13B, and a second voltage generation circuit 350B to be described later.

The first command register 322A receives a command CMD from the input/output circuit 31, and holds the command CMD. Then, the sequencer module 33 executes various operations based on the command CMD held in the first command register 322A.

The sequencer module 33 includes the first sequencer module (which is, e.g., a sequence control circuit) 330A, the second sequencer module (which is, e.g., a sequence control circuit) 330B, and a control circuit 330C. The control circuit 330C controls the operation of the entire semiconductor memory device 10, including the first sequencer module 330A and the second sequencer module 330B, based on the transmitted command CMD. The first sequencer module 330A and the second sequencer module 330B are independently controllable. The first sequencer module 330A is able to execute various operations such as the data read operation on the plane <0>. The second sequencer module 330B is able to execute various operations such as the data read operation on the plane <1>. When the first sequencer module 330A and the second sequencer module 330B are not distinguished from each other, the modules will be referred to as the sequencer module 330.

The ready/busy control circuit 34 generates a ready busy signal RB, and transmits the signals to the controller 20. In the following description. The ready busy signal RB is generated based on a first internal ready busy signal RB1 corresponding to the operation state of the first sequencer module 330A provided for the plane <0>, and a second internal ready busy signal RB1 corresponding to the second sequencer module 330B provided for the plane <1>. In the following description, a state where the ready busy signal RB is the "H" level will be referred to as a ready state, and a state where the ready busy signal RB is the "L" level will be referred to as a busy state. As shown in FIG. 4, the semiconductor memory device 10 may be configured to transmit one ready busy signal RB based on the first and second internal ready busy signals RB0 and RB1. For example, the semiconductor memory device 10 may transmit the ready busy signal RB in the "H" level (the ready state) when both of the first and second internal ready busy signals RB0 and RB1 are in the "H" level, and transmit the ready busy signal RB in the "L" level (the busy state) when either one of the first and second internal ready busy signals RB0 and RB1 is in the "L" level. Even when the semiconductor memory device 10 is capable of transmitting one ready busy signal RB, the memory controller 20 can recognize the operation state of the first sequencer module 330A (the first internal ready busy signal RB0 for the plane <0>) and the operation state of the second sequencer module 330B (the second internal ready busy signal RB1 for the plane <1>), for example, by transmitting a plane status inquiry command set (a command (78h) and address add of the plane <0> or <1>). For example, after receiving the plane state inquiry command set (a command 78h and address add of the plane <0> or <1>), the semiconductor memory device 10 starts transmitting the ready busy signal RB based only on one of the first and second internal ready busy signals RB0 and RB1 whichever is designated in the command set. Upon receipt of a command for resetting the ready busy indication state, the semiconductor memory device 10 again starts transmitting the ready busy signal RB based on both of the first and second internal ready busy signals RB0 and RB1.

The voltage generation circuit 35 includes a first voltage generation circuit 350A and a second voltage generation circuit 350B. The first voltage generation circuit 350A generates a desired voltage based on an instruction from the first sequencer module 330A. The first voltage generation circuit 350A supplies the generated voltage to the memory cell array 11A, the sense amplifier module 12A, and the row decoder 13A. The second voltage generation circuit 350B generates a desired voltage based on an instruction from the second sequencer module 330B. The second voltage generation circuit 350B supplies the generated voltage to the memory cell array 11B, the sense amplifier module 12B, and the row decoder 13B.

As described above, the semiconductor memory device 10 according to the present embodiment includes the multiple planes, and to be provided with the first sequencer module 330A and the second sequencer module 330B which are independently operable.

[1-2] Read Operation

Figure 5:
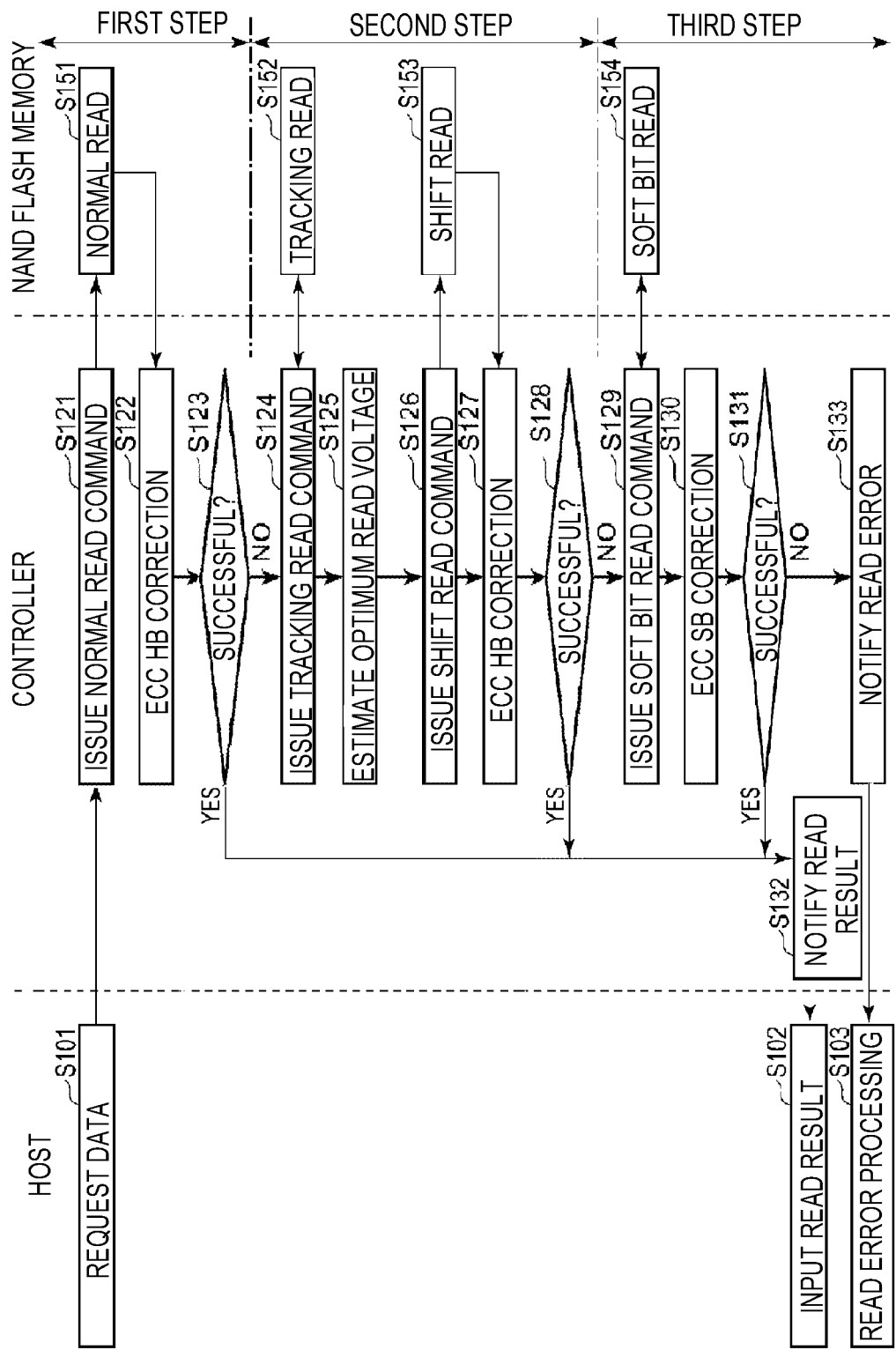
FIG. 5 is a flowchart illustrating a data read operation of the semiconductor memory device according to the embodiment.

Next, an example of the data read operation according to the present embodiment will be described. FIG. 5 is a flowchart of the read operation. In FIG. 5, the operation of the NAND type flash memory 10 is executed under the control of, for example, the sequencer module 33, and the operation of the controller 20 is executed under the control of, for example, the processor 21.

As illustrated in FIG. 5, the read operation according to the present embodiment substantially includes three steps (first to third steps). The first step is an operation related to a normal read. The second step is an operation related to an optimum read voltage search and a shift read by a threshold voltage (Vth) tracking. The third step is an operation related to a soft bit read and a soft decision.

[1-2-1] First Step

First, the first step will be described. First, the processor 21 of the controller 20 issues a normal read command in response to a data request from the host device, and transmits the normal read command to the NAND type flash memory 10 (steps S101 and S121).

The normal read command is stored in, for example, the command register 322 of the NAND type flash memory 10. In response, the sequencer module 33 executes the normal read (step S151). In the read operation, the sequencer module 33 causes the voltage generation circuit 35 to apply a default read voltage to a selected word line WLi (i is an integer of 0 or more) and apply the voltage Vread to a non-selected word line WL. Then, in the read operation, the data read to the bit line BL is fetched into the sense amplifier module.

The data read in step S151 is held in, for example, the buffer memory 25 of the controller 20. Then, the ECC circuit 23 checks the presence or absence of errors in the read data, and when errors exist, the ECC circuit 23 attempts a correction (hard bit decoding) (step S122). When the errors can be corrected ("YES" in step S123), the controller 20 outputs corrected data to the host device (step S132). As a result, the data requested in step S101 is input to the host device (step S102).

Meanwhile, when the errors cannot be corrected ("NO" in step S123), the read operation proceeds to the second step.

In addition, the normal read typically includes a cell read and a cache read. The cell read is an operation to read data from the memory cell array 11 to a latch circuit in the sense amplifier module 12. The cache read operation is an operation to read data from the latch circuit in the sense amplifier module 12 to the controller 20 via the input/output circuit 31.

Thus, when desired data is stored in the latch circuit of the sense amplifier module 12, the controller 20 may omit the cell read and perform only the cache read.

[1-2-2] Second Step

In the second step, an optimum value of the read voltage in the read operation is estimated, and the read is performed again using the estimated voltage. Various methods may be applied to the estimation of the optimum value. In this example, a crossing point of threshold voltage distributions is regarded as the optimum value by using a tracking read.

Figure 6:
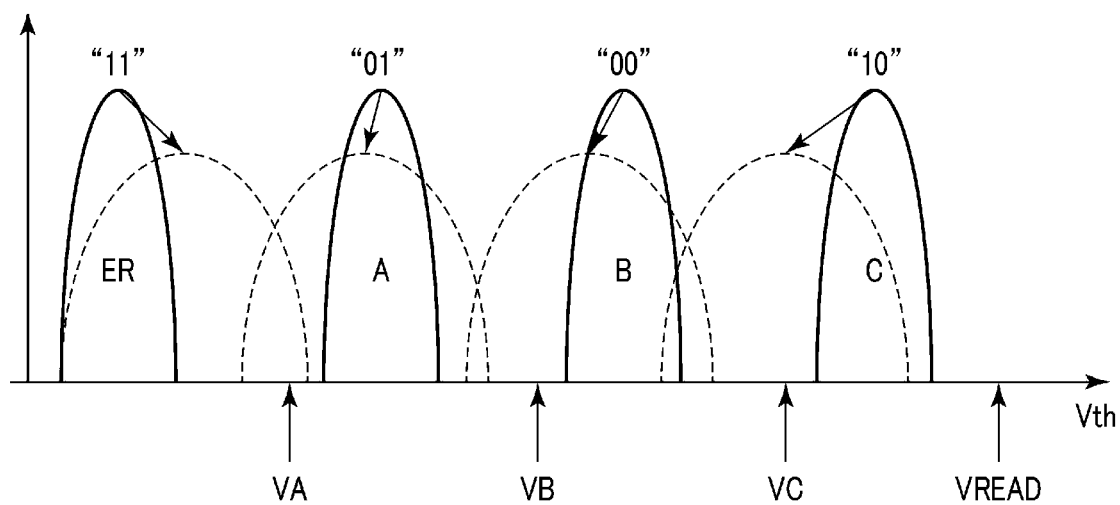
FIG. 6 is another threshold voltage distribution of memory cells.

For example, when the threshold voltage distributions are as illustrated in FIG. 3, they are separated from each other, and distinguishable from each other by each read voltage. However, when time elapses after data is written, the widths of the threshold voltage distributions become wider due to various factors, and adjacent threshold voltage distributions may overlap with each other. FIG. 6 illustrates such threshold voltage distributions.

As described above, when the widths of the threshold voltage distributions become wider so that adjacent threshold voltage distributions overlap each other, the default read voltage may not necessarily be the optimum read voltage. In this case, when data is read using the read voltage, there may be a case where too many errors occur, and thus, all of the errors cannot be corrected by the hard bit decoding.

Thus, in the second step, a crossing point of threshold voltage distributions for the read operation (e.g., a crossing point of the threshold voltage distributions of "Er" level and "A" level, "A" level and "B" level, or "B" level and "C" level) is searched, so as to set a new optimum read voltage. In addition, the "optimum value" and "optimum read voltage" in the present step each mean a "read voltage that results in read data that can be corrected by hard bit decoding" and does not literally mean an optimum value which results in read data having the least number of errors.

Specifically, the processor 21 of the controller 20 issues a tracking read command (step S124), and transmits the tracking read command to the NAND type flash memory 10. The tracking read command is stored in, for example, the command register 322 of the NAND type flash memory 10. In response, the sequencer module 33 executes a Vth tracking read (step S152).

For example, the Vth tracking read relates to counting the number of on-cells while changing the value of the read voltage within a specific range around a read voltage VA. The number of on-cells at each read voltage is held in, for example, the RAM 22 of the controller 20. Then, the processor 21 estimates the optimum read voltage for the read operation (step S125). For example, assuming that VA1 to VAn (n is a natural number of 2 or more) are used as read voltages, a difference between the number of on-cells at VAj (j is a natural number of 2 or more) and the number of on-cells at VAj−1 is calculated, and a voltage at which the difference is the smallest is regarded as a crossing point of the threshold voltage distributions of "ER" level and "A" level, that is, the optimum read voltage VA' of the read operation. With respect to optimum read voltages of the read operations at other levels, a crossing point may also be obtained by the Vth tracking read as in the method described above, or an optimum read voltage may be estimated from an already obtained optimum read voltage without performing the Vth tracking read.

In addition, the read voltages VA1 to VAn in the Vth tracking read are generated by shifting a read voltage based on a voltage shift amount stored in, for example, the external feature register 310A or the internal feature register 310B. The number of times the read voltage is shifted is also stored in, for example, the external feature register 310A or the internal feature register 310B. A method of setting the voltage shift amount or the number of shifting times in the external feature register 310A or the internal feature register 310B will be described later.

Then, the processor 21 of the controller 20 issues a shift read command (step S126), and transmits the shift read command together with the voltage shift amount, to the NAND type flash memory 10. The voltage shift amount indicates a difference between the default read voltage and the optimum read voltage estimated in step S125. In addition, instead of the difference, the value of the optimum read voltage itself may be transmitted to the NAND type flash memory 10. The shift read command is stored in, for example, the command register 322 of the NAND type flash memory 10. In addition, the voltage shift amount is stored in the external feature register 310A or the internal feature register 310B. In response, the sequencer module 33 executes the shift read using the voltage obtained in step S125 (step S153). The shift read is the same as the normal read, except that the shift read uses the optimal read voltage.

In addition, the optimum read voltage used in the shift read is generated based on the voltage shift amount or the number of shifting times stored in, for example, the external feature register 310A or the internal feature register 310B. A method of setting the voltage shift amount or the number of shifting times in the external feature register 310A or the internal feature register 310B will be described later.

The data read in step S153 is stored in, for example, the buffer memory 25 of the controller 20. Then, the ECC circuit 23 checks the presence or absence of errors in the read data, and when errors exist, the ECC circuit 23 attempts a correction (hard bit decoding) (step S127). When the errors can be corrected ("YES" in step S128), the controller 20 outputs corrected data to the host device (step S132). Meanwhile, when the errors cannot be corrected ("NO" in step S128), the read operation proceeds to the third step.

[1-2-3] Third Step

In the third step, a soft bit is generated by the soft bit read, and an error correction is performed based on the soft bit (hereinafter referred to as soft bit decoding). Here, for example, a read operation in which a data decision is performed using one threshold voltage is referred to as a hard bit read, and information read by the hard bit read is referred to as a hard bit. Meanwhile, a read operation in which a data decision is performed using multiple threshold voltages is referred to as a soft bit read, and information read by the soft bit read is referred to as a soft bit. The third step will be described below.

First, the general flow of the third step will be described. As illustrated in FIG. 5, when the hard bit decoding has failed in the second step ("NO" in step S128), the processor 21 of the controller 20 issues a soft bit read command (step S129), and transmits the soft bit read command to the NAND type flash memory 10. First, the soft bit read command issued in step S129 sets various read conditions in the NAND type flash memory 10.

Then, the soft bit read command causes data to be read from a memory cell and held in a designated latch circuit. Then, a hard bit HB and a soft bit SB are finally held in the latch circuit in the sense amplifier module 12 according to the already set read conditions.

Then, the controller 20 reads the hard bit HB and the soft bit SB from the sense amplifier module 12, and holds the hard bit HB and the soft bit SB in, for example, the buffer memory 25. Then, the ECC circuit 23 performs the soft decision using the read hard bit HB and soft bit SB, so as to attempt the error correction (step S130). When errors can be corrected ("YES" in step S131), the controller 20 outputs corrected data to the host device (steps S132 and S102). On the other hand, when errors cannot be corrected ("NO" in step S131), the processor 21 notifies the host device of the failure of the read operation (step S133), and the host device performs error processing (step S103).

[1-2-4] Set Feature Operation

Next, the flow of the set feature operation according to the present embodiment will be described.

Figure 7:
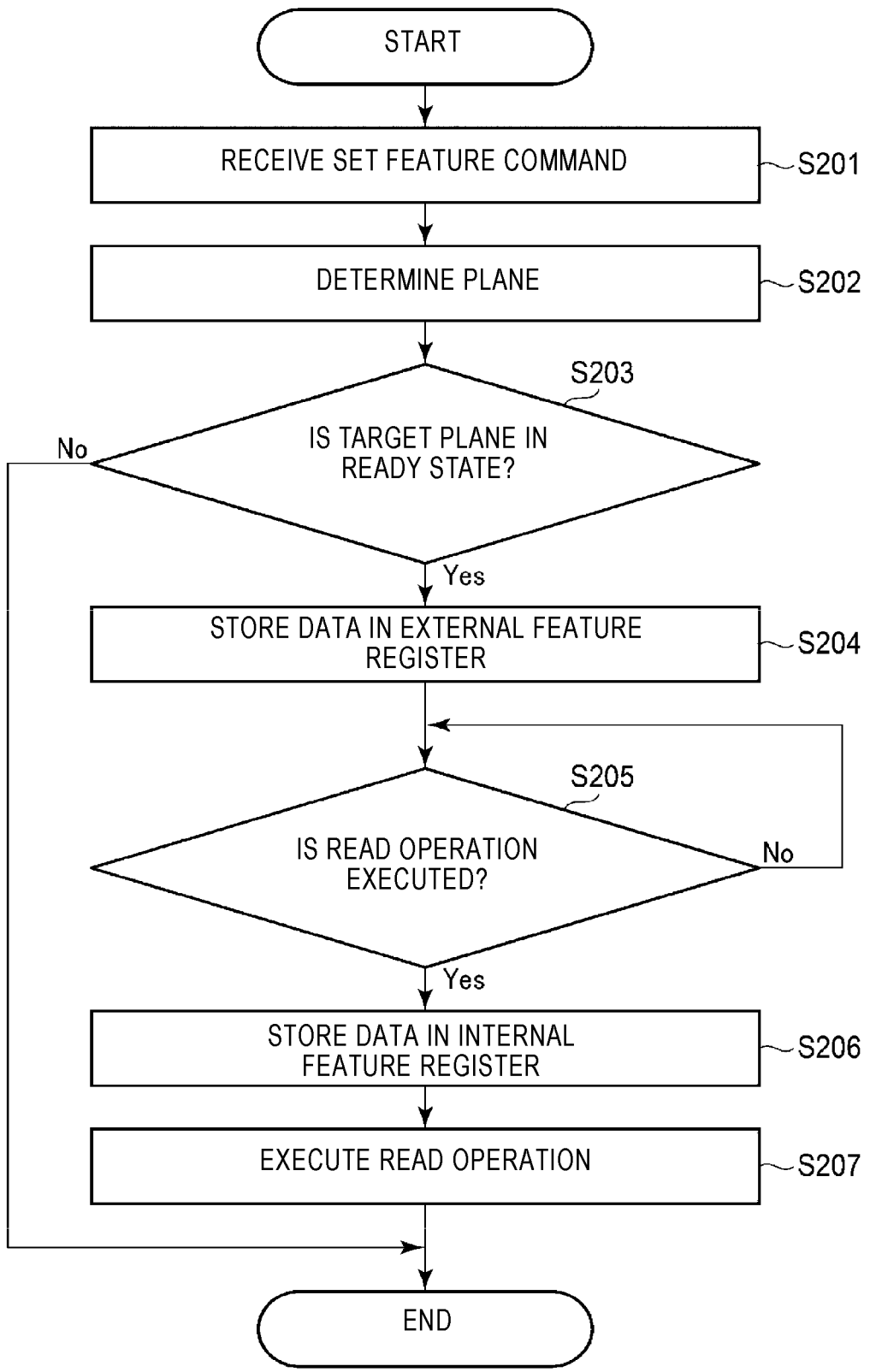
FIG. 7 is a flowchart illustrating a general flow of a set feature operation of the semiconductor memory device according to the embodiment.
Figure 8:
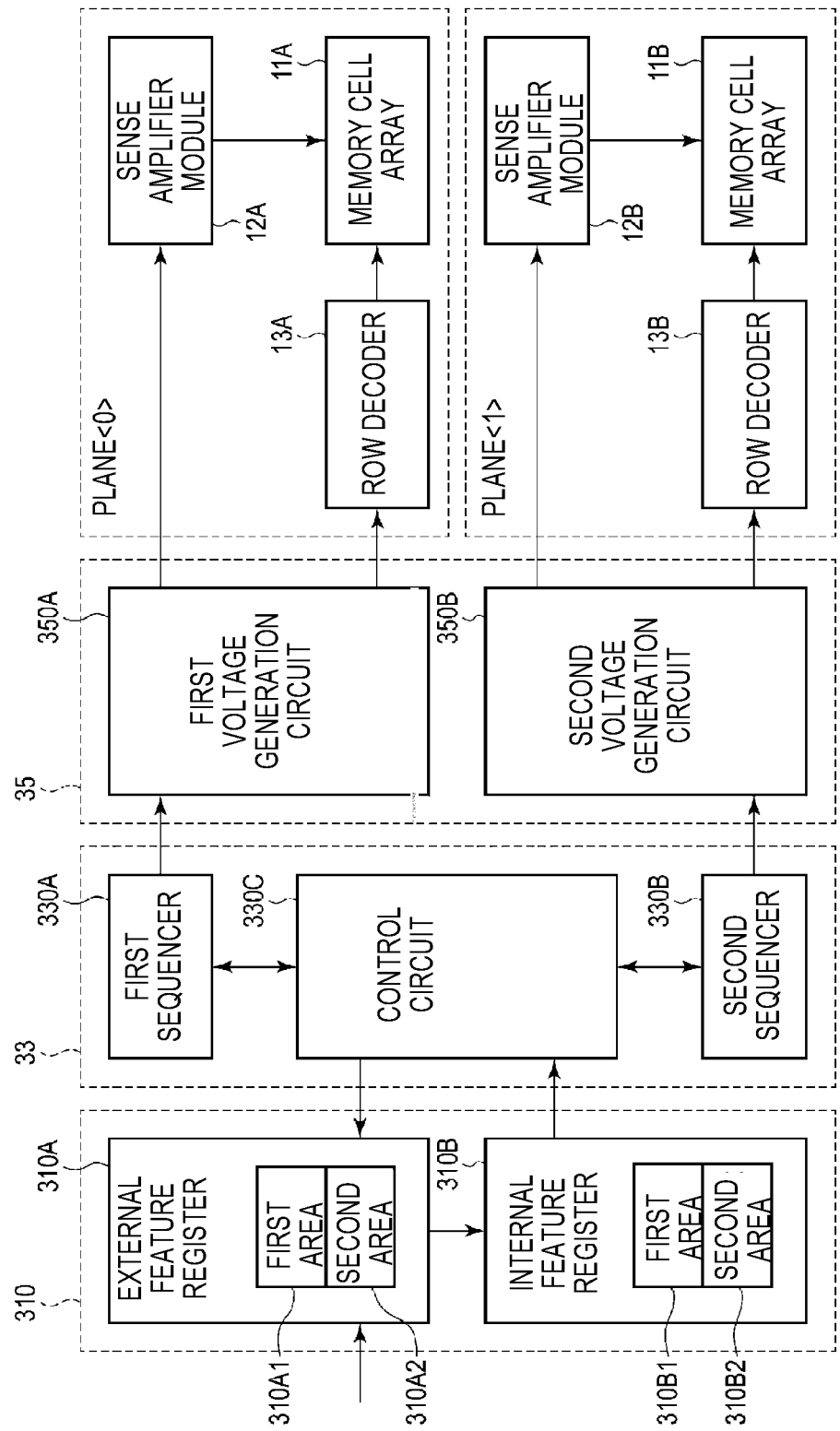
FIG. 8 is a block diagram illustrating a portion of a peripheral circuit and planes for describing the set feature operation.

First, the general flow of the set feature operation according to the present embodiment will be described with reference to FIGS. 7 and 8. FIG. 7 is a flowchart illustrating the general flow of the set feature operation according to the present embodiment. FIG. 8 illustrates a portion of the peripheral circuit 14 and the planes for describing the set feature operation.

Hereinafter, descriptions will be made with reference to FIGS. 7 and 8.

The set feature operation is performed by receiving a set feature command set issued by the controller 20 (S201). The command set means a signal group including, for example, an address or data, in addition to a command.

The set feature command set includes a command D5h indicating a set feature command, an address CHP indicating a chip address, an address FA in the external feature register 310A, and data D to be stored in the external feature register 310A.

The set feature command set does not include an address that directly designates a plane. Instead, a different address FA is allocated for each plane and so the plane can be determined from the address FA. The relationship between the address FA and the plane is stored in a table of any desired storage area. Accordingly, the control circuit 330C may specify the plane from the address FA by referring to the table of the desired storage area. That is, when the set feature command set is received, the control circuit 330C specifies the plane to which the data D corresponds, based on the address FA.

In addition, the desired storage area may be any location which is accessible by the control circuit 330C, and may be formed in, for example, the control circuit 330C.

For example, when the set feature command set is received, the control circuit 330C determines the plane to which the command set is related, based on the address FA (S202).

Then, the control circuit 330C determines whether the sequencer (330A or 330B) which is the target of the command is in the ready state (S203).

When it is determined that the sequencer which is the target of the command is in the busy state ("NO" in S203), the set feature operation is not performed (end).

When it is determined that the sequencer module 330 which is the target of the command is in the ready state ("YES" in S203), the data included in the set feature command set is stored in the external feature register 310A (S204). In addition, the external feature register 310A includes the area 310A1 (PB0) that stores data about the plane <0> and the area 310A2 (PB1) that stores data about the plane <1>. The areas 310A1 (PB0) and 310A2 (PB1) are designated by the addresses FA included in the set feature command set.

Thereafter, when the read operation is performed on the plane to which the set feature command set has been input ("YES" in S205), the control circuit 330C stores the data D stored in the external feature register 310A, in the internal feature register 310B (S206).

Then, the sequencer module 330 corresponding to the plane designated by the command set performs the read operation on the plane by using the data D stored in the internal feature register 310B (S207).

[1-2-4-1] Example 1 of Set Feature Operation

Figure 9:
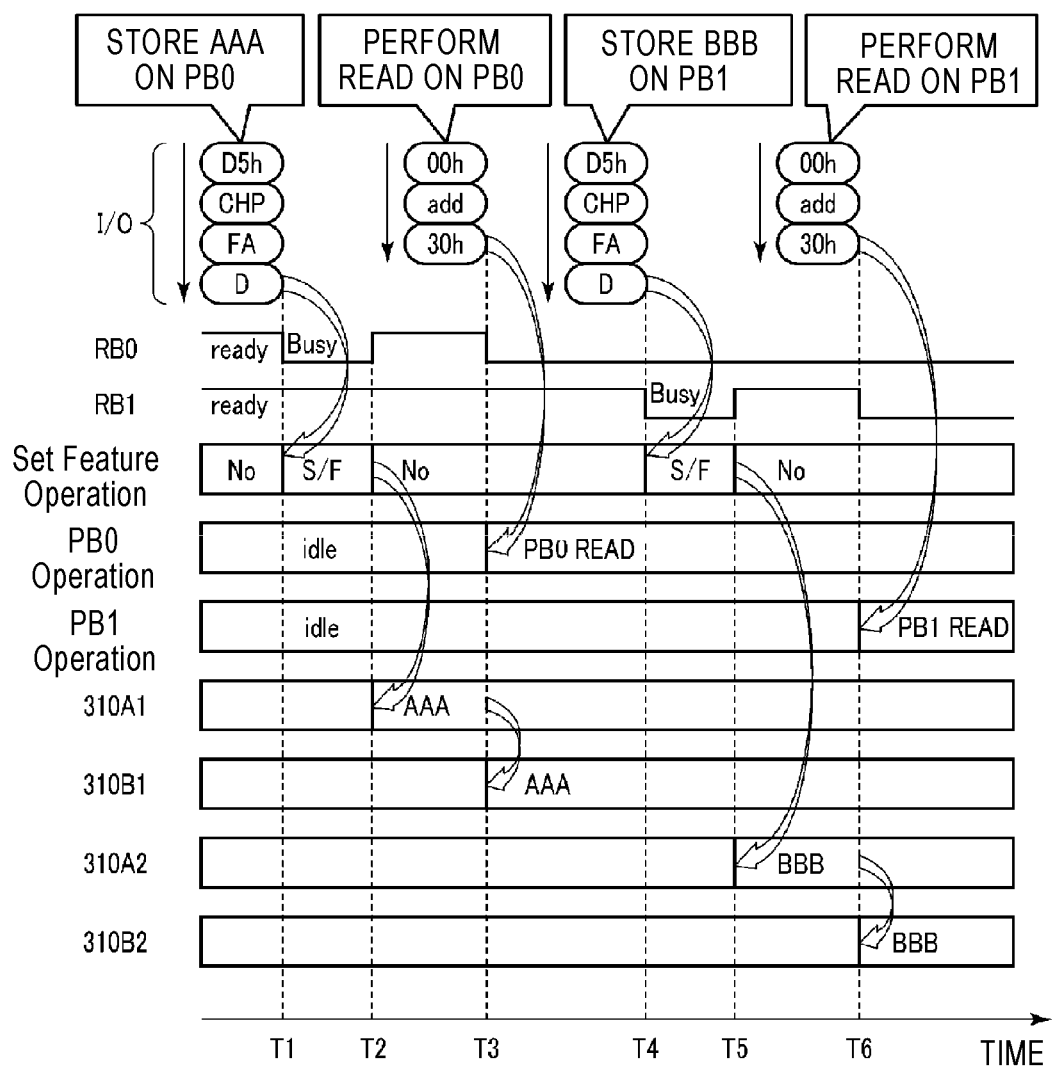
FIGS. 9-12 are examples of a command sequence of the data read operation of the semiconductor memory device according to the embodiment.

First, an example 1 of the set feature operation according to the present embodiment will be described with reference to FIG. 9. FIG. 9 is a command sequence representing the example 1 of the set feature operation according to the present embodiment. Here, the command set is stacked in the vertical direction in the drawing. In addition, it is assumed that the command set is transmitted from the controller 20 in the direction of the arrows in the drawing.

The example of FIG. 9 represents a case where the set feature operation on the plane <0>, the read operation on the plane <0>, the set feature operation on the plane <1>, and the read operation on the plane <1> are performed in this order. In addition, the set feature operation sets data for the Vth tracking read, the shift read, or the soft bit read, and the read operation following the set feature operation is, for example, the Vth tracking read, the shift read, or the soft bit read.

As illustrated in FIG. 9, first, the set feature command set is input from the controller 20 to the NAND type flash memory 10 (time T1). This set feature command set is a command set for requesting that data D to be used at the time of the read operation (hereinafter, AAA) be stored in the address FA for the plane <0>.

Since the plane <0> is in the ready state (RB0="H") at the time the set feature command set is input, the control circuit 330C executes the set feature operation. As a result, the plane <0> goes into the busy state (RB0="L") at time T1 (until time T2). Then, based on the command from the control circuit 330C, the data AAA is stored in the first area 310A1 (which is the storage area for the plane <0>) of the external feature register 310A (time T2).

Subsequently, a read command set (command 00h, address add, and command 30h) is input from the controller 20 to the NAND type flash memory 10 (time T3). This command set is a command set for requesting that the read operation be performed on the plane <0>. The address add included in the read command set includes an address that designates the plane.

Since the plane <0> is in the ready state (RB0="H") at the time the read command set is input, the first sequencer module 330A starts the read operation of the plane <0>. As a result, the plane <0> goes into the busy state (RB0="L") (time T3). Before the first sequencer module 330A starts the read operation of the plane <0>, the control circuit 330C migrates the data AAA stored in the first area 310A1 of the external feature register 310A to the first area 310B1 (the storage area for the plane <0>) of the internal feature register 310B. Then, when the data AAA is stored in the first area 310B1 of the internal feature register 310B, the first sequencer module 330A starts the read operation of the plane <0> (time T3).

In this manner, the first sequencer module 330A is able to perform the read operation based on the data AAA, on the plane <0>.

At time T4 when the plane <0> is busy, the set feature command set is input from the controller 20 to the NAND type flash memory 10. This set feature command set is a command set for requesting that data D to be used at the time of the read operation (hereinafter, BBB) be stored in the address FA for the plane <1>.

Since the plane <1> is in the ready state (PB1="H") at the time the set feature command set is input, the control circuit 330C executes the set feature operation. As a result, the plane <1> goes into the busy state (RB1="L") at time T4 (until time T5). Then, based on the command from the control circuit 330C, the data BBB is stored in the second area 310A2 (the storage area for the plane <1>) of the external feature register 310A (time T5).

In addition, at the time the set feature command set for the plane <1> is input, the plane <0> is in the busy state.

However, the operation on the plane <0> and the operation on the plane <1> are independently controlled by the first sequencer module 330A and the second sequencer module 330B. Thus, even though the plane <0> is in the busy state, the operation on the plane <1> may be performed as long as the plane <1> is in the ready state.

Subsequently, a read command set (command 00h, address add, and command 30h) is input from the controller 20 to the NAND type flash memory 10 (time T6). This command set is a command set for requesting that the read operation be performed on the plane <1>. As described, for example, the controller 20 can recognize the operation state of the plane <1> using the plane state inquiry command set (a command 78h and address add of the plane <1>).

Since the plane <1> is in the ready state (RB1="H") at the time the read command set is input, the second sequencer module 330B starts the read operation of the plane <1>. As a result, the plane <1> goes into the busy state (RB1="L") (time T6). Before the second sequencer module 330B starts the read operation of the plane <1>, the control circuit 330C migrates the data BBB stored in the second area 310A2 of the external feature register 310A to the second area 310B2 (the storage area for the plane <1>) of the internal feature register 310B. Then, when the data BBB is stored in the second area 310B2 of the internal feature register 310B, the second sequencer module 330B starts the read operation of the plane <1> (time T6).

In this manner, the second sequencer module 330B is able to perform the read operation based on the data BBB, on the plane <1>.

As described above, the semiconductor memory device 10 according to the present embodiment is able to asynchronously perform the set feature operation on the planes <0> and <1>.

[1-2-4-2] Example 2 of Set Feature Operation

Figure 10:
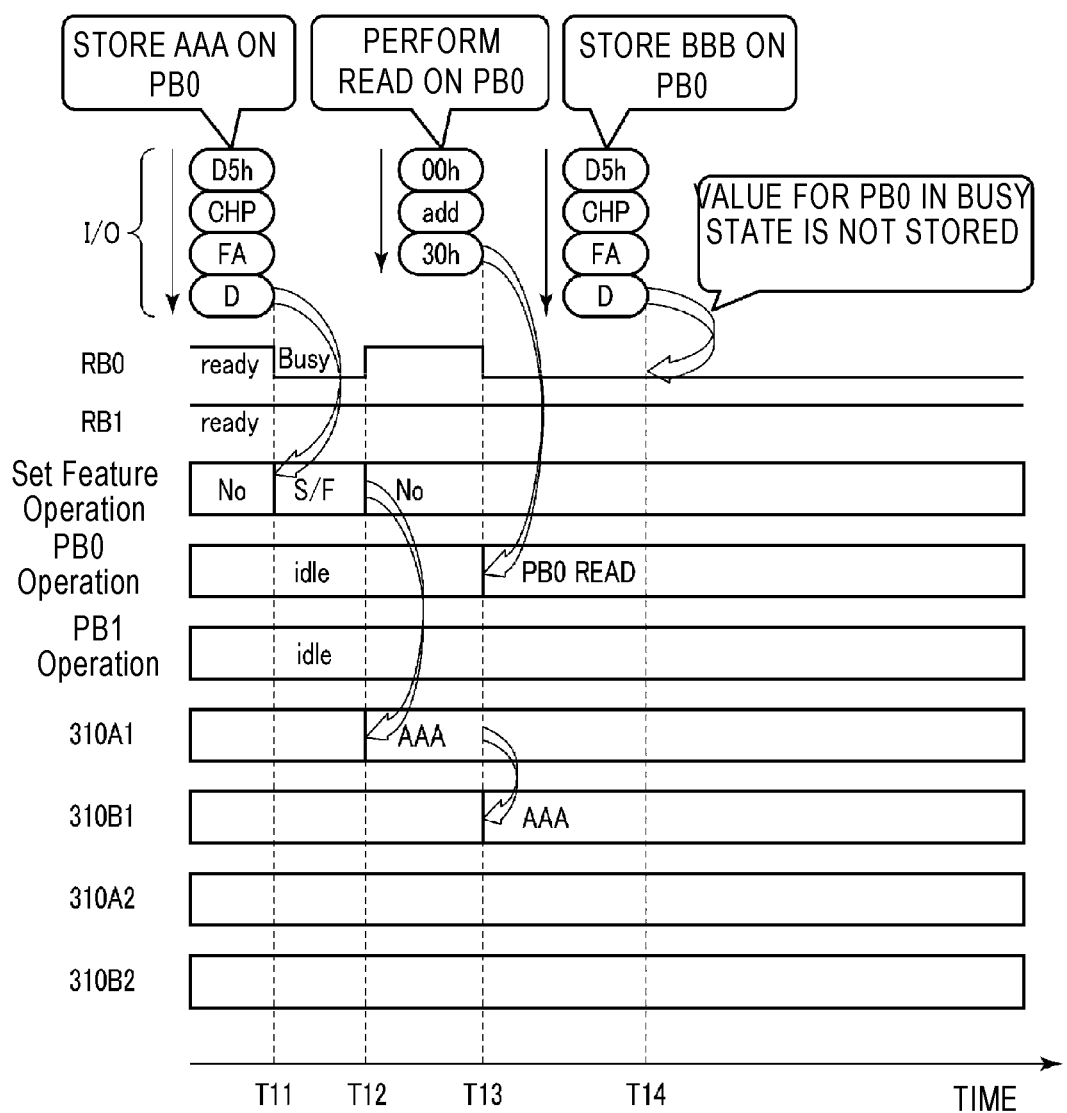

An example 2 of the set feature operation according to the present embodiment will be described with reference to FIG. 10. FIG. 10 is a command sequence representing the example 2 of the set feature operation according to the present embodiment. Here, the command set is stacked in the vertical direction in the drawing. In addition, it is assumed that the command set is transmitted from the controller 20 in the direction of the arrows in the drawing.

The example of FIG. 10 represents a case where the set feature operation on the plane <0>, the read operation on the plane <0>, and the set feature operation on the plane <0> are performed in this order. In addition, here, the set feature operation sets data for the Vth tracking read, the shift read, or the soft bit read, and the read operation following the set feature operation is, for example, the Vth tracking read, the shift read, or the soft bit read.

Since the operations from time T11 to time T13 are the same as the operations from time T1 to time T3 of FIG. 9, descriptions thereof will be omitted.

At time T14 when the plane <0> is busy, the set feature command set is input from the controller 20 to the NAND type flash memory 10. This set feature command set is a command set for requesting that data D to be used at the time of the read operation (hereinafter, BBB) be stored in the address FA for the plane <0>.

At the time when the set feature command set is input, the plane <0> is in the busy state (RB0="L"). Since the plane <0> is in the busy state, it is likely that the plane <0> is being subjected to the read operation. Thus, the control circuit 330C does not execute the set feature operation on the busy plane <0> that is in the busy state. As a result, the data BBB is not stored in the first area 310A1 (the storage area for the plane <0>) of the external feature register 310A.

As described above, the semiconductor memory device 10 according to the present embodiment can prevent the update of the feature register even when the set feature command set is issued, with respect to the plane that is being subjected to the read operation.

[1-2-4-3] Example 3 of Set Feature Operation

Figure 11:
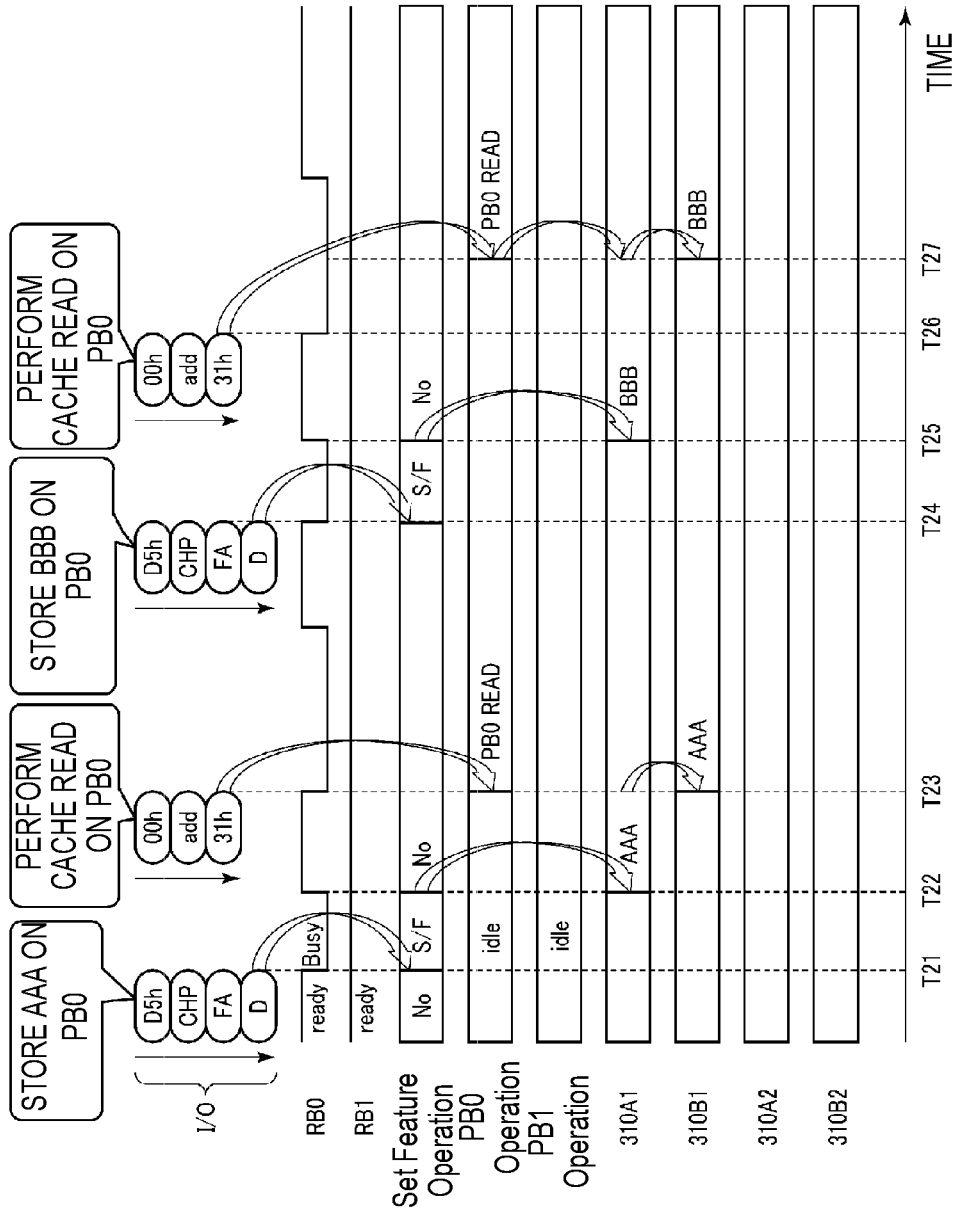

An example 3 of the set feature operation according to the present embodiment will be described with reference to FIG. 11. FIG. 11 is a command sequence representing the example 3 of the set feature operation according to the present embodiment. Here, the command set is stacked in the vertical direction in the drawing. In addition, it is assumed that the command set is transmitted from the controller 20 in the direction of the arrows in the drawing.

The example of FIG. 11 represents a case where the set feature operation on the plane <0>, the cache read operation on the plane <0>, the set feature operation on the plane <0>, and the cache read operation on the plane <0> are performed in this order. In addition, here, the set feature operation sets data for the cache read operation.

Since the operations from time T21 and time T22 are the same as the operations from the times T1 and T2 in FIG. 9, descriptions thereof will be omitted.

At time T23 after the set feature operation is performed, a cache read command set (command 00h, address add, and command 31h) is input from the controller 20 to the NAND type flash memory 10. This command set is a command set for requesting that the cache read operation be performed on the plane <0>. The address add included in the cache read command set includes an address that designates the plane.

Since the plane <0> is in the ready state (RB0="H") at the time the cache read command set is input, the first sequencer module 330A starts the cache read operation on the plane <0>. As a result, the plane <0> goes into the busy state (RB0="L") (time T23). Before the first sequencer module 330A starts the cache read operation of the plane <0>, the control circuit 330C migrates the data AAA stored in the first area 310A1 (the storage area for the plane <0>) of the external feature register 310A to the first area 310B1 (the storage area for the plane <0>) of the internal feature register 310B. Then, when the data AAA is stored in the first area 310A1 of the internal feature register 310B, the first sequencer module 330A starts the cache read operation of the plane <0> (time T23).

In this manner, the first sequencer module 330A is able to perform the cache read operation based on the data AAA, on the plane <0>.

At time T24, a set feature command set is input from the controller 20 to the NAND type flash memory 10. This set feature command set is a command set for requesting that data D to be used at the time of the cache read operation (hereinafter, BBB) be stored in the address FA for the plane <0>.

Since the plane <0> is in the ready state at the time the set feature command set is input, the control circuit 330C performs the set feature operation. Then, based on the command from the control circuit 330C, the data BBB is stored in the first area 310A1 of the external feature register 310A (time T25).

Subsequently, a cache read command set (command 00h, address add, and command 31h) is input from the controller 20 to the NAND type flash memory 10 (time T26). This command set is a command set for requesting that the cache read operation be performed on the plane <0>.

Although the plane <0> is in the ready state (RB0="H") at the time the cache read command set is input at time T26, the cache read operation that started at time T23 has not been completed. Thus, while the first sequencer module 330A is holding the cache read data at time T26 until the cache read operation that started at time T23 has completed, the plane <0> goes into the busy state (time T26).

Then, at time T27, when the cache read operation that started at time T23 has completed, the first sequencer module 330A starts the cache read operation of time T26 on the plane <0>. Before the first sequencer module 330A starts the cache read operation on the plane <0>, the control circuit 330C migrates the data BBB stored in the first area 310A1 of the external feature register 310A to the first area 310B1 of the internal feature register 310B. Then, when the data BBB is stored in the first area 310B1 of the internal feature register 310B, the first sequencer module 330A starts the cache read operation on the plane <0> (time T27).

In this manner, the first sequencer module 330A is able to perform the cache read operation based on the data BBB, on the plane <0>.

[1-2-4-4] Example 4 of Set Feature Operation

Figure 12:
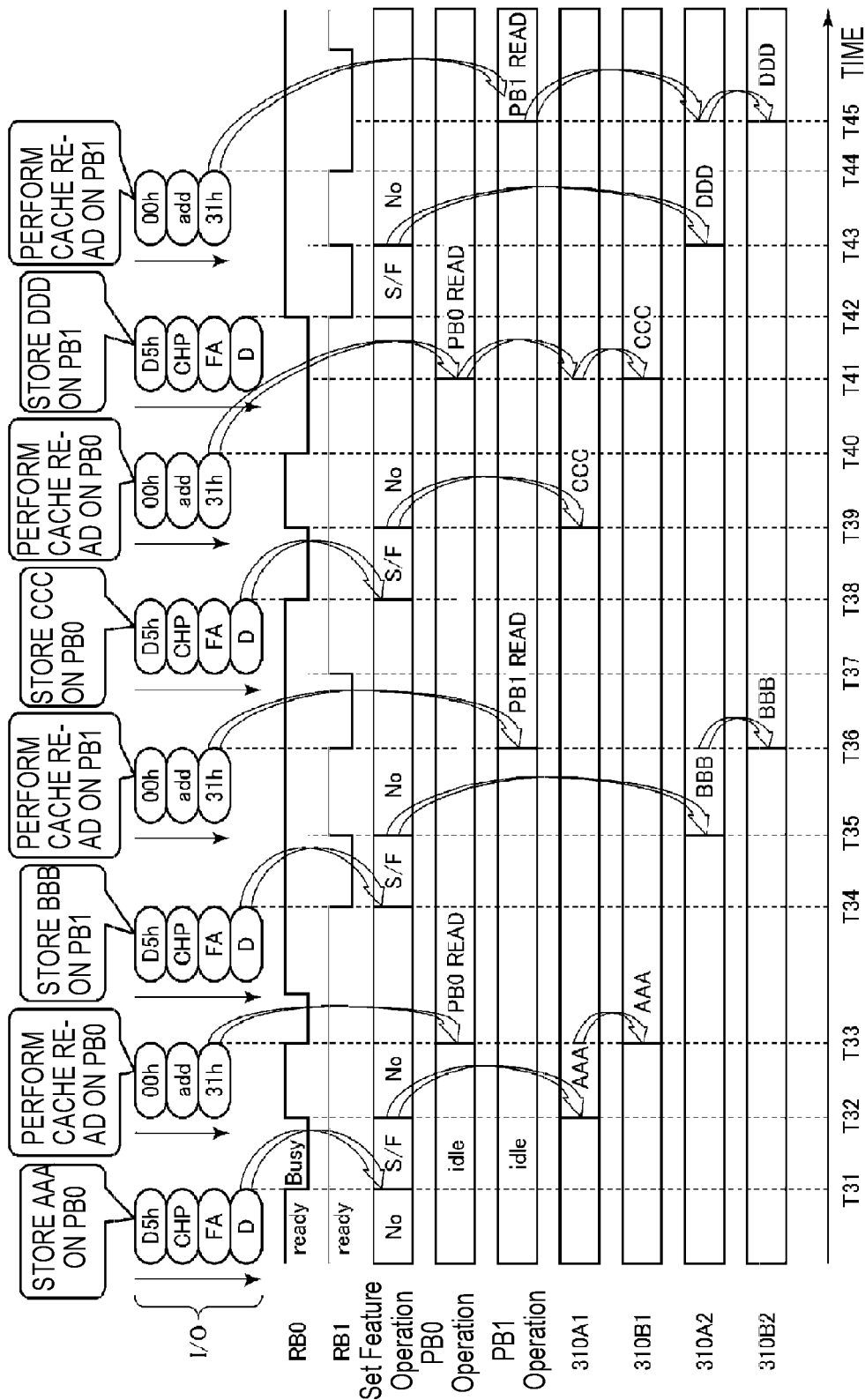

An example 4 of the set feature operation according to the present embodiment will be described with reference to FIG. 12. FIG. 12 is a command sequence illustrating the example 4 of the set feature operation according to the present embodiment. Here, the command set is stacked in the vertical direction in the drawing. In addition, it is assumed that the command set is transmitted from the controller 20 in the direction of the arrows in the drawing.

The example of FIG. 12 represents a case where the set feature operation on the plane <0>, the cache read operation on the plane <0>, the set feature operation on the plane <1>, the cache read operation on the plane <1>, the set feature operation on the plane <0>, the cache read operation on the plane <0>, the set feature operation on the plane <1>, and the cache read operation on the plane <1> are performed in this order. In addition, here, the set feature operation sets data for the cache read operation.

Since the operations from time T31 to time T33 are the same as the operations from time T21 to time T23 in FIG. 11, descriptions thereof will be omitted.

At time T34 during which the cache read operation on the plane <0> is executed, a set feature command set is input. This set feature command set is a command set for requesting that data D to be used at the time of the cache read operation (hereinafter, BBB) be stored in the address FA for the plane <1>.

Since the plane <1> is in the ready state (RB0="H") at the time the set feature command set is input, the control circuit 330C performs the set feature operation. Then, based on the command from the control circuit 330C, the data BBB is stored in the second area 310A2 (the storage area for the plane <1>) of the external feature register 310A (time T35).

Subsequently, a cache read command set (command 00h, address add, and command 31h) is input from the controller 20 to the NAND type flash memory 10 (time T36). This command set is a command set for requesting that the cache read operation be performed on the plane <1>.

Since the plane <1> is in the ready state (RB1="H") at the time the cache read command set is input, the second sequencer module 330B starts the cache read operation on the plane <1>. As a result, the plane <1> goes into the busy state (RB1="L") (time T36). Before the second sequencer module 330B starts the cache read operation on the plane <1>, the control circuit 330C migrates the data BBB stored in the second area 310A2 of the external feature register 310A to the second area 310B2 (the storage area for the plane <1>) of the internal feature register 310B. Then, when the data BBB is stored in the second area 310B2 of the internal feature register 310B, the second sequencer module 330B starts the cache read operation on the plane <1> (time T36).

In this manner, the second sequencer module 330B is able to perform the cache read operation based on the data BBB, on the plane <1>.

At time T38, a set feature command set is input from the controller 20 to the NAND type flash memory 10. This set feature command set is a command set for requesting that data D to be used at the time of the cache read operation (hereinafter, CCC) be stored in the address FA for the plane <0>.

Since the plane <0> is in the ready state at the time the set feature command set is input, the control circuit 330C performs the set feature operation. Then, based on the command from the control circuit 330C, the data CCC is stored in the first area 310A1 (the storage area for the plane <0>) of the external feature register 310A (time T39).

Subsequently, a cache read command set (command 00h, address add, and command 31h) is input from the controller 20 to the NAND type flash memory 10. This command set is a command set for requesting that the cache read operation be performed on the plane <0>.

While the plane <0> is in the ready state (RB0="H") at the time the cache read command set is input, the cache read operation started at time T33 is not completed. Thus, while the first sequencer module 330A holds the cache read data at time T40 until the cache read operation started at time T33 is completed, the plane <0> goes into the busy state (RB0="L") (time T40).

Then, at time T41, when the cache read operation started at time T33 is completed, the first sequencer module 330A starts the cache read operation at time T40 on the plane <0>. Before the first sequencer module 330A starts the cache read operation on the plane <0>, the control circuit 330C migrates the data CCC stored in the first area 310A1 of the external feature register 310A to the first area 310B1 (the storage area for the plane <0>) of the internal feature register 310B. Then, when the data CCC is stored in the first area 310B1 of the internal feature register 310B, the first sequencer module 330A starts the cache read operation on the plane <0> (time T41).

In this manner, the first sequencer module 330A is able to perform the cache read operation based on the data CCC, on the plane <0>.

At time T42, a set feature command set is input from the controller 20 to the NAND type flash memory 10. This set feature command set is a command set for requesting that data D to be used at the time of the cache read operation (hereinafter, DDD) be stored in the address FA for the plane <1>.

Since the plane <1> is in the ready state at the time the set feature command set is input, the control circuit 330C performs the set feature operation. Then, based on the command from the control circuit 330C, the data DDD is stored in the second area 310A2 of the external feature register 310A (time T43).

Subsequently, a cache read command set (command 00h, address add, and command 31h) is input from the controller 20 to the NAND type flash memory 10. This command set is a command set for requesting that the cache read operation be performed on the plane <1>.

While the plane <1> is in the ready state (RB1="H") at the time the cache read command set is input, the cache read started from the time T36 is not completed. Thus, while the second sequencer module 330B holds the cache read operation at time T44 until the cache read operation started at time T36 is completed, the plane <1> goes into the busy state (RB1="L") (time T44).

Then, at time T45, when the cache read operation started at time T36 is completed, the second sequencer module 330B starts the cache read operation at time T44 on the plane <1>. Before the second sequencer module 330B starts the cache read operation on the plane <1>, the control circuit 330C migrates the data DDD stored in the second area 310A2 of the external feature register 310A to the second area 310B2 of the internal feature register 310B. Then, when the data DDD is stored in the second area 310B2 of the internal feature register 310B, the second sequencer module 330B starts the cache read operation of the plane <1> (time T45).

In this manner, the first sequencer module 330A is able to perform the cache read operation based on the data DDD, on the plane <1>.

[1-3] Effect

According to the semiconductor memory device 10 of the embodiment, an appropriate read operation can be executed. The details of the effect will be described below.

The read operation of the semiconductor memory device is executed by a sequencer in the semiconductor memory device based on information such as a command received from the memory controller. When the semiconductor memory device includes, for example, two planes, an external host device may separately and concurrently instruct a read of data stored in one plane and a read of data stored in the other plane.

In this case, for example, the memory controller may instruct a shift read operation on the planes <0> and <1>. For example, an address in which a condition value of each plane is stored may not be set in a feature register. However, the condition of the shift read operation (e.g., a voltage shift amount and an optimum read voltage) may vary according to each plane. Thus, when the shift read operation is performed on the planes <0> and <1>, the shift read operation may not be performed on any one of the planes <0> and <1> by using an appropriate condition of the shift read operation.

More specifically, when the condition of the shift register operation on the plane <0> is stored in the feature register, there is a case where the shift read operation is performed on the planes <0> and <1> at the same time. In this case, the shift read operation on the plane <1> is executed using the condition of the shift read operation on the plane <0>. Thus, the shift read operation may not be appropriately performed on the plane <1>.

In addition, it is possible that after the shift read operation on the plane <0> is completed, the condition of the shift read operation on the plane <1> is stored in the feature register, and the shift read operation on the plane <1> is performed. However, in this case, a waiting time occurs with respect to the operation of the plane <1>, which causes a problem in that the operation speed becomes slow.

However, according to the embodiment described above, an address in which a condition value of each plane can be stored is set in a feature register. Then, the sequencer module is able to determine the plane that a command set is targeting, from the address of the feature register. Thus, the condition for each plane can be stored in the feature register. Then, even when the shift read operation is performed on the planes <0> and <1> at the same time, the shift read operation can be performed on the planes <0> and <1> using their respective appropriate conditions. Thus, the problem described above is solved. That is, the read operation can be accurately performed at a high speed. Further, while the shift read operation has been described, the embodiment is not limited thereto. The same effect as described above can be obtained from other types of read operations.

In addition, the application of the embodiment described above is not limited to the read operation, and even when the read operation, the write operation, and/or the erase operation are asynchronously performed with multiple planes, it is possible to set an appropriate condition for the operation of each plane in the feature register while preventing the occurrence of waiting time.

[2] Modifications, etc.

In addition, in the embodiment described above, the example where the sequencer module 33 includes the first sequencer module 330A, the second sequencer module 330B, and the control circuit 330C has been described. However, the present disclosure is not limited thereto. The sequencer module 33 may have any configuration which is able to asynchronously perform the read operation, the write operation, and/or the erase operation on multiple planes.

In the embodiment described above, the example where the semiconductor memory device includes two planes has been described. However, the present disclosure is not limited thereto. For example, the semiconductor memory device may include three or more planes. In this case, at least the sequencer module 33 and the voltage generation circuit 35 are configured such that the respective planes may operate independently and asynchronously. Further, the ready busy control circuit 34 is configured to output ready busy signals of the respective planes.

In the description above, the "connection" indicates an electrical connection, and includes not only a direct connection but also a connection via any element.

In addition, the configuration where memory cells are three-dimensionally stacked on a semiconductor substrate may be employed. This configuration is described in, for example, U.S. patent application Ser. No. 12/407,403, filed on Mar. 19, 2009 and entitled "Three-Dimensionally Stacked Nonvolatile Semiconductor Memory." Other such configurations are described in U.S. patent application Ser. No. 12/406,524, filed on Mar. 18, 2009 and entitled "Three-Dimensionally Stacked Nonvolatile Semiconductor Memory," U.S. patent application Ser. No. 12/679,991, filed on Mar. 25, 2010 and entitled "Nonvolatile Semiconductor Memory Device and Manufacturing Method Thereof," and U.S. patent application Ser. No. 12/532,030, filed on Mar. 23, 2009 and entitled "Semiconductor Memory and Manufacturing Method Thereof." The entire descriptions of the patent applications above are incorporated herein by reference.

In addition, in the embodiment described above, the block BLK may not be the data erase unit. For example, other erase operations are described in U.S. patent application Ser. No. 13/235,359, filed on Sep. 18, 2011 and entitled "Nonvolatile Semiconductor Memory Device," and U.S. patent application Ser. No. 12/694,690, filed on Jan. 27, 2010 and entitled "Nonvolatile Semiconductor Memory Device." The entire descriptions of the patent applications above are incorporated herein by reference.

According to each embodiment described above, (1) In the read operation, a voltage which is applied to a selected word line for the read operation of the "A" level is, for example, 0 V to 0.55 V. The voltage is not limited thereto, and may be any one of 0.1 V to 0.24 V, 0.21 V to 0.31 V, 0.31 V to 0.4 V, 0.4 V to 0.5 V, and 0.5 V to 0.55 V.

A voltage which is applied to a selected word line for the read operation of the "B" level is, for example, 1.5 V to 2.3V. The voltage is not limited thereto, and may be any one of 1.65 V to 1.8 V, 1.8 V to 1.95 V, 1.95 V to 2.1 V, and 2.1 V to 2.3 V.

A voltage which is applied to a selected word line for the read operation of the "C" level is, for example, 3.0 V to 4.0 V. The voltage is not limited thereto, and may be any one of 3.0 V to 3.2 V, 3.2 V to 3.4 V, 3.4 V to 3.5 V, and 3.5 V to 33 V, and 33 V to 4.0 V.

The time (tRead) for the read operation may be, for example, 25 µs to 35 µs, 35 µs to 70 µs, or 70 µs to 80 µs.

(2) The write operation includes a program operation and a verify operation as described above. In the write operation, a voltage which is initially applied to a word line selected at the time of the program operation is, for example, 134 V to 14.3 V. The voltage is not limited thereto, and may be, for example, any one of 134 V to 14.0 V and 14.0 V to 14.6 V.

A voltage which is initially applied to a selected word line when an odd-numbered word line is written may be exchanged with a voltage which is initially applied to a selected word line when an even-numbered word line is written.

When the program operation is performed by an incremental step pulse program (ISPP) method, a step-up voltage may be, for example, about 0.5 V.

A voltage which is applied to an non-selected word line may be, for example, 6.0 V to 7.3 V. The voltage is not limited thereto, and may be, for example, 7.3 V to 8.4 V or 6.0 V or lower.

A pass voltage to be applied may be changed depending on whether an non-selected word line is an odd-numbered word line or an even-numbered word line.

The time (tProg) for the write operation may be, for example, 1,700 µs to 1,800 µs, 1,800 µs to 1,900 µs, or 1,900 µs to 2,000 µs.

(3) In the erase operation, a voltage which is initially applied to a well formed on the semiconductor board and provided with the memory cells thereon is, for example, 12.0 V to 13.3 V. The voltage is not limited thereto, and may be, for example, 13.3 V to 14.8 V, 14.8 V to 19.0 V, 19.0 V to 19.8 V, or 19.8 V to 21.0 V.

The time (tErase) for the erase operation may be, for example, 3,000 µs to 4,000 µs, 4,000 µs to 5,000 µs, or 4,000 µs to 9,000 µs.

(4) The structure of a memory cell has a charge storage layer that is disposed on a semiconductor substrate (e.g., silicon substrate) via a tunnel insulation film having a film thickness of 4 nm to 10 nm. The charge storage layer may have a stacked structure of an insulation film having a film thickness 2 nm to 3 nm such as SiN or SiON and polysilicon having a film thickness of 3 nm to 8 nm. Metals such as Ru may be added to the polysilicon. An insulation film is provided on the charge storage layer. This insulation film has a silicon oxide film having a film thickness of 4 nm to 10 nm and sandwiched between a lower-layer High-k film having a film thickness of 3 nm to 10 nm and an upper-layer High-k film having a film thickness of 3 nm to 10 nm. The High-k film may be, for example, HfO. In addition, the film thickness of the silicon oxide film may be made thicker than the film thickness of the High-k films. A control electrode having a film thickness of 30 nm to 70 nm is formed on the insulation film via a material having a film thickness of 3 nm to 10 nm. Here, the material may be a metal oxide film such as TaO or a metal nitride film such as TaN. The control electrode may be, for example, W.

In addition, an air gap may be formed between memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first plane including a memory cell array;
a second plane including a memory cell array;
a control circuit configured to control operations performed on the first and second planes separately and independently; and
a first register for storing a condition value related to a condition of an operation to be performed on one of the planes, wherein:
when a first command to store a first condition value in a first address of the first register is received, the control circuit specifies a plane to which the first address has been allocated;
when the first plane is specified by the first address, the control circuit determines whether the first plane is in a command receivable state;
when the control circuit determines that the first plane is in the command receivable state, the control circuit stores the first condition value in the first address of the first register;
when the first condition value is stored in the first address of the first register, and a second command for a first read operation on the first plane is received, the control circuit determines whether the first plane is in a command receivable state; and
when the control circuit determines that the first plane is in the command receivable state, the control circuit executes the first read operation based on the first condition value, and further wherein:
when the first command is received while the second plane is not in the command receivable state, the control circuit still stores the first condition value in the first address of the first register;
when the second command is received while the second plane is not in the command receivable state, the control circuit still executes the first read operation based on the first condition value;
when a third command to store a second condition value in a second address of the first register is received, the control circuit specifies a plane to which the second address has been allocated;
when the second plane is specified by the second address, the control circuit determines whether the second plane is in a command receivable state; and
when the control circuit determines that the second plane is not in the command receivable state, the control circuit does not store the second condition value in the second address of the first register.

2. The semiconductor memory device according to claim 1, further comprising:
a second register having a first storage area and a second storage area, wherein
the condition value stored in the first address of the first register is moved to the first storage area of the second register prior to execution of an operation on the first plane that is based on the condition value, and
the condition value stored in the second address of the first register is moved to the second storage area of the second register prior to execution of an operation on the second plane that is based on the condition value.

3. The semiconductor memory device according to claim 1, wherein the control circuit includes a first control circuit configured to control operations performed on the first plane and a second control circuit configured to control operations performed on the second plane.

4. The semiconductor memory device according to claim 3, further comprising:
a ready/busy circuit configured to output a first ready/busy signal indicating whether or not the first plane is in a command receivable state and a second ready/busy signal indicating whether or not the second plane is in a command receivable state.

5. The semiconductor memory device according to claim 4, wherein the ready/busy circuit is configured to generate the first ready/busy signal based on an operation state of the first control circuit and not the second control circuit and to generate the second ready/busy signal based on an operation state of the second control circuit and not the first control circuit.

6. The semiconductor memory device according to claim 5, further comprising:
a voltage generation circuit configured to generate voltages for operations performed on the first and second planes, the voltage generation circuit including a first voltage generation circuit under control of the first control circuit to generate voltages for the first plane and a second voltage generation circuit under control of the second control circuit to generate voltages for the second plane.

7. A method of controlling an operation performed on first and second planes of a semiconductor memory device, said method comprising:
allocating first and second addresses in a register for the first and second planes, respectively;
upon receiving a first command to store a first condition value for performing an operation on one of the planes, the first command including an address of the register, determining that the first command is specifying the first plane if the address in the first command is the one that has been allocated to the first plane and that the first command is specifying the second plane if the address in the first command is the one that has been allocated to the second plane;
determining that the plane specified by the first command is in a command receivable state;
upon determining that the plane specified by the first command is in a command receivable state is in the command receivable state, storing the first condition value in the first address of the first register;
when the first condition value is stored in the first address of the first register, and a second command for a first read operation on the first plane is received, further determining whether the first plane is in a command receivable state;
upon further determining that the first plane is in the command receivable state, executing the first read operation based on the first condition value;
upon receiving a third command to store a second condition value in a second address of the first register, determining that the third command is specifying the second plane; and
determining whether the second plane is in a command receivable state,
wherein, upon determining that the second plane is not in the command receivable state, the second condition value is not stored in the second address of the first register, and
wherein, when the first command is received while the second plane is not in the command receivable state, the first condition value is still stored in the first address of the first register, and when the second command is received while the second plane is not in the command receivable state, the first read operation is still executed based on the first condition value.

8. The method according to claim 7, further comprising:
moving the condition value stored in the first address of the first register to a first storage area of a second register prior to execution of an operation on the first plane that is based on the condition value, and
moving the condition value stored in the second address of the first register to a second storage area of the second register prior to execution of an operation on the second plane that is based on the condition value.

9. The method according to claim 7, wherein the semiconductor memory device includes a first control circuit configured to control operations performed on the first plane and a second control circuit configured to control operations performed on the second plane.

10. The method according to claim 9, further comprising:
outputting a first ready/busy signal indicating whether or not the first plane is in a command receivable state and a second ready/busy signal indicating whether or not the second plane is in a command receivable state.

11. The method according to claim 10, further comprising:
generating the first ready/busy signal based on an operation state of the first control circuit and not the second control circuit; and
generating the second ready/busy signal based on an operation state of the second control circuit and not the first control circuit.

12. The method according to claim 11, further comprising:
generate voltages for operations performed on the first plane under control of the first control circuit; and
generate voltages for operations performed on the second plane under control of the second control circuit.

* * * * *